US009276350B1

(12) United States Patent
Wang

(10) Patent No.: US 9,276,350 B1
(45) Date of Patent: Mar. 1, 2016

(54) WATERPROOF ELECTRIC PLUG WITH TRANSFORMER

(71) Applicant: TING SHEN INDUSTRIAL CO., LTD, Hsinchu (TW)

(72) Inventor: Lien-Sheng Wang, Hsinchu (TW)

(73) Assignee: TING SHEN INDUSTRIAL CO., LTD., Hsinchu (TW)

( * ) Notice: Subject to any disclaimer, the term of this patent is extended or adjusted under 35 U.S.C. 154(b) by 0 days.

(21) Appl. No.: 14/451,626

(22) Filed: Aug. 5, 2014

(51) Int. Cl.
*H05K 5/00* (2006.01)
*H01R 13/52* (2006.01)
*H01R 13/66* (2006.01)

(52) U.S. Cl.
CPC ........ *H01R 13/5202* (2013.01); *H01R 13/6633* (2013.01)

(58) Field of Classification Search
CPC ........ H05K 7/142
USPC ........ 439/76.1; 174/50.52, 50.53, 50.62; 361/752
See application file for complete search history.

(56) References Cited

U.S. PATENT DOCUMENTS 6,707,678 B2 * 3/2004 Kobayashi ............. H05K 5/062 361/752
7,390,199 B2 * 6/2008 Honda ............. H01R 12/57 439/78
7,412,895 B2 * 8/2008 Asada ............. G01L 19/0084 73/706
7,419,385 B2 * 9/2008 Itou ............. H01R 12/724 439/76.1
7,744,381 B2 * 6/2010 Honda ............. H05K 5/0052 439/79
7,755,907 B2 * 7/2010 Inagaki ............. B60R 16/0239 174/50.5
7,789,696 B2 * 9/2010 Umei ............. H05K 5/0247 439/447
8,139,364 B2 * 3/2012 Wickett ............. H05K 5/0039 174/50
8,342,861 B2 * 1/2013 Stiehl ............. H01R 24/30 439/695
8,651,879 B2 * 2/2014 Stiehl ............. H01R 24/30 439/76.1
8,721,351 B2 * 5/2014 Nitta ............. G01B 7/003 439/76.1
8,908,380 B2 * 12/2014 Ohhashi ............. H05K 5/0052 174/535
8,942,001 B2 * 1/2015 Kawai ............. H05K 5/0052 174/50.5

* cited by examiner

*Primary Examiner* — Phuong Dinh

(57) ABSTRACT

A waterproof electric plug is provided with a housing including two forward prongs, an open rear end, a closed groove on the rear end, and a closed trough on the rear end wherein length of the trough is greater than that of the groove; a transformer in the housing and electrically connected to the prongs; a cap including a closed projection on a forward end, and a closed protrusion on the forward end wherein length of the protrusion is greater than that of the projection; an electrical socket disposed through the cap and electrically connected to the transformer; and adhesive disposed in the groove. The projection is complimentarily disposed in the groove to press the adhesive for forming a first waterproof structure. The protrusion is complimentarily disposed in the trough to form a second waterproof structure.

2 Claims, 8 Drawing Sheets

WATERPROOF ELECTRIC PLUG WITH TRANSFORMER

BACKGROUND OF THE INVENTION

1. Field of Invention

The invention relates to electric plugs and more particularly to an improved waterproof electric plug having a transformer.

2. Description of Related Art

Alternating-current (AC) power is required to transform into direct current (DC) power prior to supplying to small electric or electronic products such as mobile phones, lamps, Christmas lamp strings, etc. For example, plugs of Christmas lamp strings are required to be waterproof because in often times they are used outsides. Rain, water, and moisture may enter plugs that are not waterproof when the plugs are used outsides. This can cause short circuit to the plugs.

However, many types of waterproof electric plugs having a transformer for Christmas lamp strings have complicated components and poor quality. For example, as shown in FIGS. 1 and 2, a conventional electric plug comprises a housing 10, two prongs 102 on a front surface of the housing 10, a closed groove 103 on a rear end, and two opposite slots 104 on a rectangular flange at the rear end of the housing 10; a cap 13 including a closed protrusion 131 on an edge facing the housing 10 and two opposite projections 132, a closed waterproof strip 12 made of elastomeric material complimentarily disposed in the trough 131, and a transformer 11 disposed in an internal space 101 of the housing 10. In an assembled state of the electric plug the projections 132 are inserted through the slots 104 by snapping, and the protrusion 131 is disposed in the trough 131 to urge against the strip 12.

However, the strip 12 may suffer elastic fatigue as time evolves. Thus, such configured plugs may be not waterproof as desired. Further, portions of the projections 132 are exposed and it is visually unaesthetic.

Thus, the need for improvement still exists.

SUMMARY OF THE INVENTION

It is therefore one object of the invention to provide a waterproof electric plug with a transformer having the advantages including quick, simple, and easy assembly due to snapping coupling arrangement, low production cost, and reliable quality waterproof arrangement in the joining portion of cap and housing so as to prevent rain, water, and moisture from entering the housing.

For achieving above and other objects of the invention, there is provided an electric plug comprising an internally hollowed housing including two forward prongs, an open rear end, a closed groove formed on an open rear end, and a closed trough formed on the open rear end wherein length of the trough is greater than that of the groove and the trough is disposed externally of the groove; a transformer disposed in the internally hollowed housing and electrically connected to the prongs; a cap including a closed projection formed on a forward end, and a closed protrusion formed on the forward end wherein length of the protrusion is greater than that of the projection and the protrusion is disposed externally of the projection; an electrical socket disposed through the cap and electrically connected to the transformer; and adhesive disposed in the groove; wherein the projection is complimentarily disposed in the groove to press the adhesive for forming a first waterproof structure; and wherein the protrusion is complimentarily disposed in the trough to form a second waterproof structure.

The above and other objects, features and advantages of the invention will become apparent from the following detailed description taken with the accompanying drawings.

DETAILED DESCRIPTION OF THE INVENTION

Figure 1:
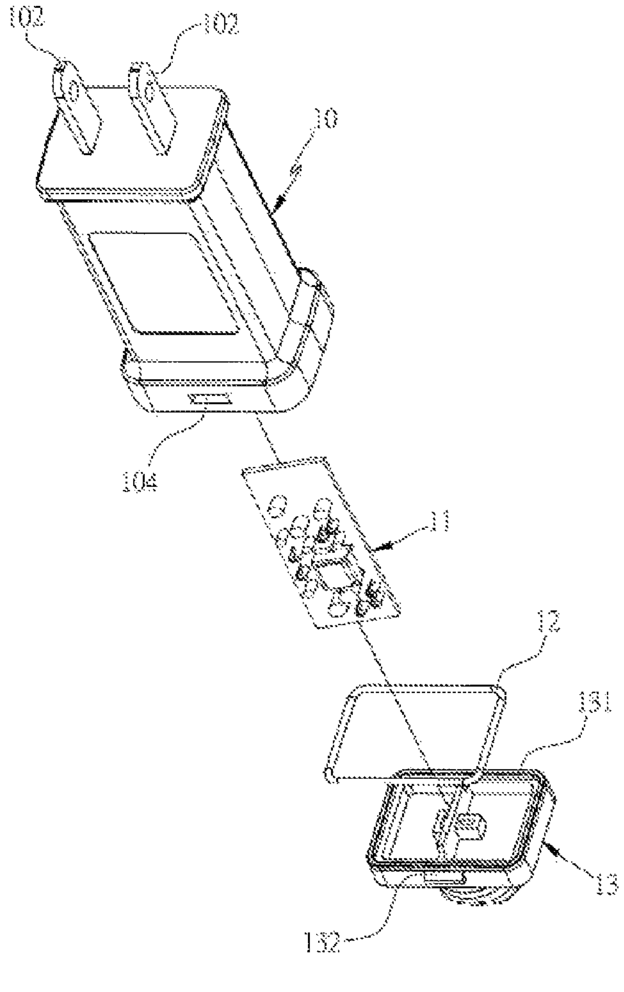
Fig. 1 Prior Art
FIG. 1 is an exploded view of a conventional waterproof electric plug.
Figure 2:
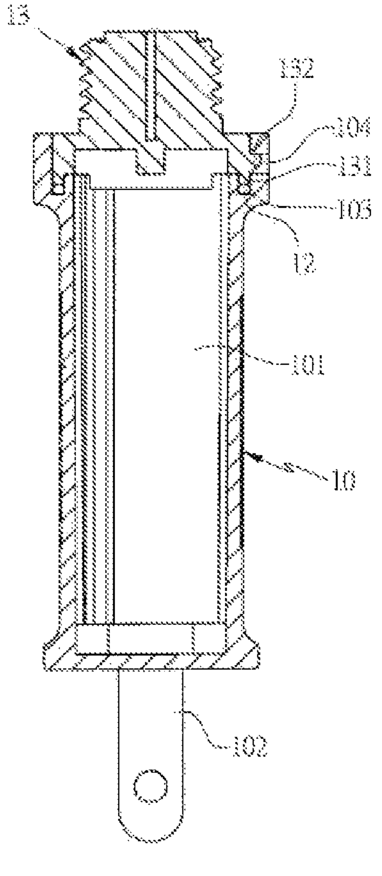
Fig. 2 Prior Art
FIG. 2 is a longitudinal sectional view of the conventional waterproof electric plug.
Figure 3:
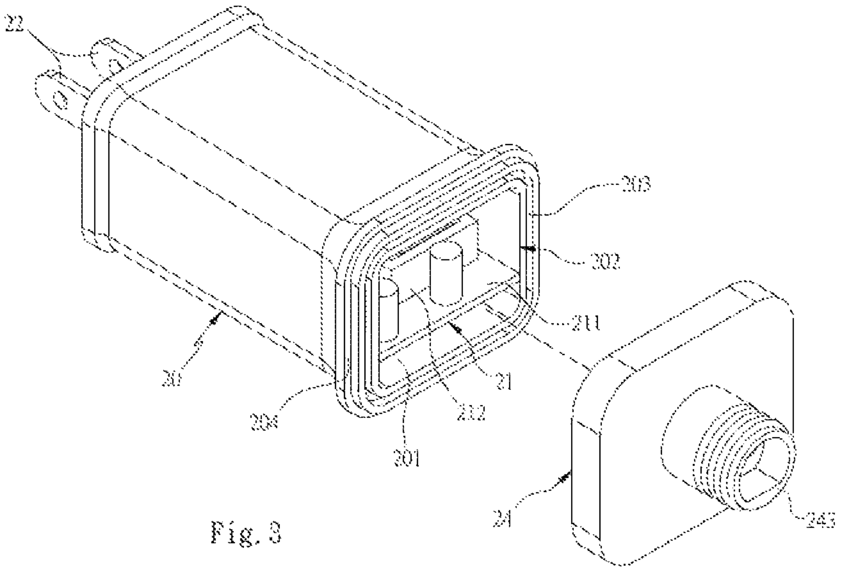
FIG. 3 is an exploded, perspective view of a waterproof electric plug according to a first preferred embodiment of the invention.
Figure 4:
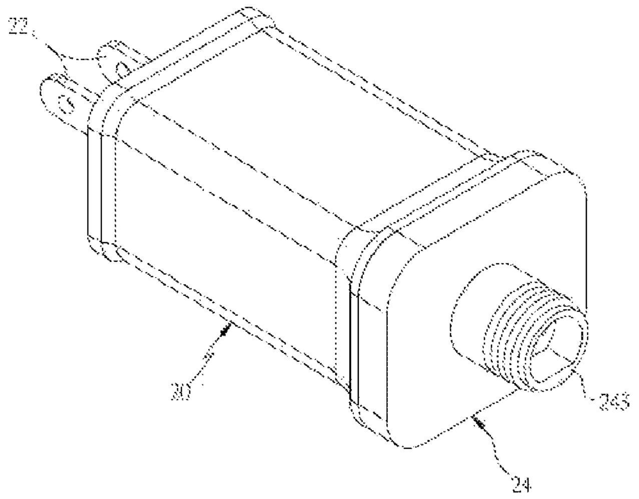
FIG. 4 is a perspective view of the waterproof electric plug shown in FIG. 3.
Figure 5:
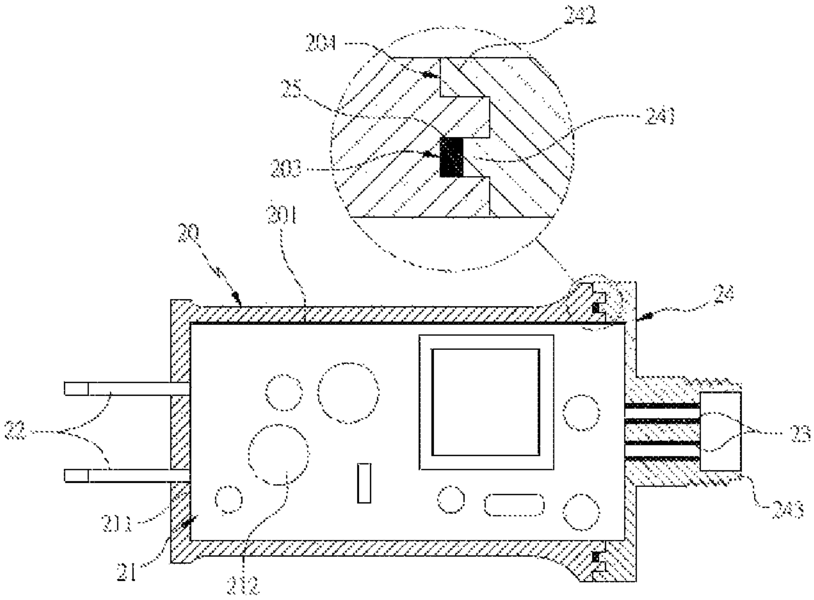
FIG. 5 is a longitudinal sectional view of the waterproof electric plug of FIG. 4.

Referring to FIGS. 3 to 5, a waterproof electric plug in accordance with a first preferred embodiment of the invention comprises a housing 20, a transformer unit 21, and a rear, hollow cap 24. Each component will be discussed in detail below.

The housing 20 is an internally hollowed parallelepiped and comprises an internal space 201 including a rear opening 202, a pair of prongs 22 integrally formed on a front end, a closed groove 203 on an enlarged rear end facing the cap 24, and a closed trough 204 on the rear end facing the cap 24, length of the trough 204 being greater than that of the groove 203 and the trough 204 being disposed externally of the groove 203.

The transformer unit 21 is mounted in the space 201 and comprises a printed circuit board (PCB) 211 electrically connected to the prongs 22 which is adapted to insert into, for example, a wall outlet for connecting to mains electricity, and a transformer 212 mounted on the PCB 21. The transformer 212 can convert AC fed from the prong 22 to DC as known in the art. The cap 24 is rectangular and comprises a projecting rear electrical socket 243, a closed projection 241 on a forward edge facing the rear end of the housing 20, and a closed protrusion 242 on the forward edge facing the rear end of the housing 20, length of the protrusion 242 being greater than that of the projection 241 and the protrusion 242 being disposed externally of the projection 241.

In an assembled state, two conductors 23 are disposed in the electrical socket 243 and have on end electrically connected to the PCB 21 and the other end adapted to connect to an electronic device. Adhesive 25 is applied to the groove 203 and the projection 241 is complimentarily disposed in the groove 203 to press the adhesive 25 so as to form a first waterproof structure. The protrusion 242 is complimentarily disposed in the trough 204 so as to form a second waterproof structure. It is noted that the adhesive 25 is used to fasten the projection 241 and the groove 203 together using ultrasonic welding in the manufacturing process. As a result, the coupling of the cap 24 and the housing 20 is not only secured but also waterproof. Further, the electric plug is visually aesthetic due to no projecting members on both a periphery of the housing 20 and on a periphery of the cap 24.

Figure 6:
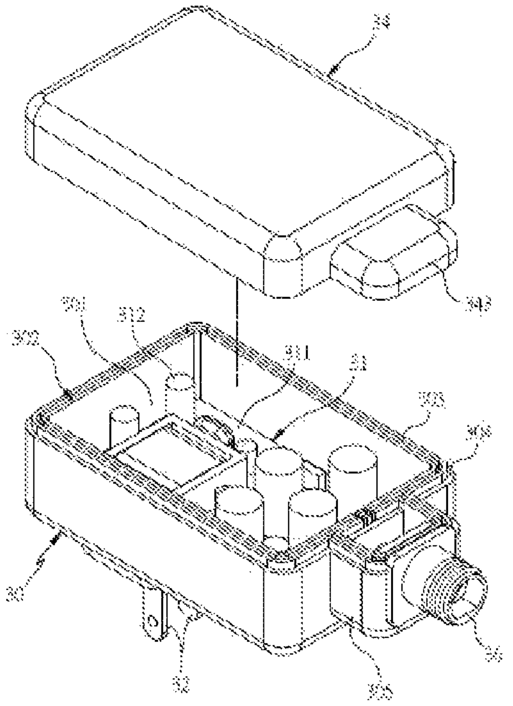
FIG. 6 is an exploded, perspective view of a waterproof electric plug according to a second preferred embodiment of the invention.
Figure 7:
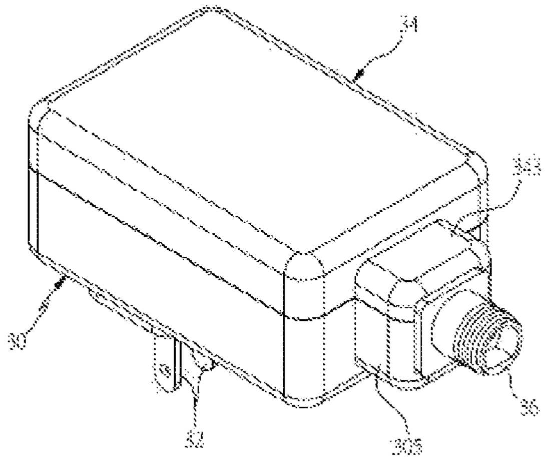
FIG. 7 is a perspective view of the waterproof electric plug shown in FIG. 6.
Figure 8:
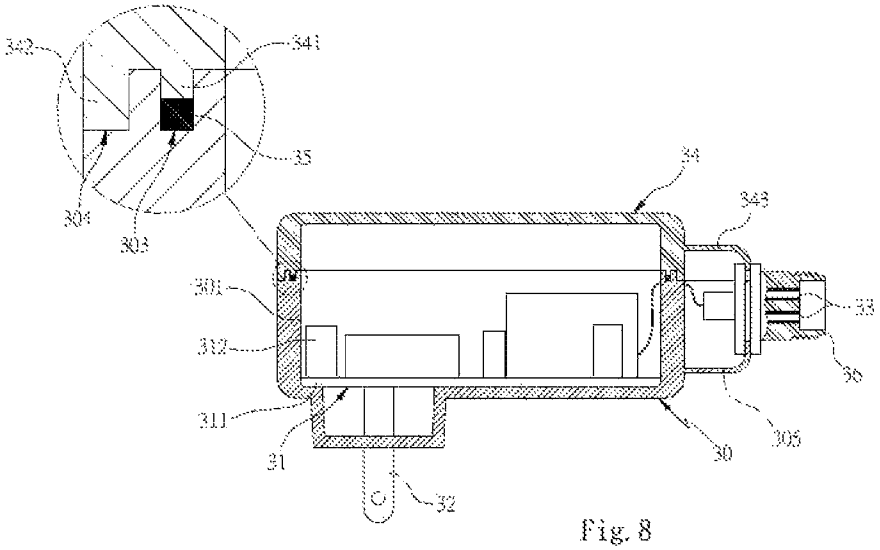
FIG. 8 is a longitudinal sectional view of the waterproof electric plug of FIG. 7.

Referring to FIGS. 6 to 8, a waterproof electric plug in accordance with a second preferred embodiment of the invention is shown. The characteristics of the second preferred embodiment are described in detailed below. The waterproof electric plug comprises a housing 30, a transformer unit 31, a cover 34, and an electrical socket 36. Each component will be discussed in detail below.

The housing 30 is an internally hollowed parallelepiped and comprises an internal space 301 including a top opening 302, a pair of prongs 32 integrally formed on an underside, a rear projecting hollow member 305, a closed groove 303 on a top edge facing the cover 34, and a closed trough 304 on the top edge facing the cover 34, length of the trough 304 being greater than that of the groove 303 and the trough 304 being disposed externally of the groove 303.

The transformer unit 31 is mounted in the space 301 and comprises a PCB 311 electrically connected to the prongs 32 which is adapted to insert into, for example, a wall outlet for connecting to mains electricity, and a transformer 312 mounted on the PCB 31. The transformer 312 can convert AC fed from the prong 32 to DC as known in the art. The cover 34 comprises a rear projecting covering member 343, a closed projection 341 on a bottom edge facing the top of the housing 30, and a closed protrusion 342 on the bottom edge facing the top of the housing 30, length of the protrusion 342 being greater than that of the projection 341 and the protrusion 342 being disposed externally of the projection 341.

In an assembled state, adhesive 35 is applied to the groove 303 and the projection 341 is complimentarily disposed in the groove 303 to press the adhesive 35 so as to form a first waterproof structure. The protrusion 342 is complimentarily disposed in the trough 304 so as to form a second waterproof structure. The socket 36 is used to secure rear ends of the hollow member 305 and the covering member 343 together. Two conductors 33 are disposed in the socket 36 and have on end electrically connected to the PCB 31 and the other end adapted to connect to an electronic device. It is noted that the adhesive 35 is used to fasten the projection 341 and the groove 303 together using ultrasonic welding in the manufacturing process. As a result, the coupling of the cover 34 and the housing 30 is not only secured but also waterproof. Further, the electric plug is visually aesthetic due to no projecting members on both a periphery of the housing 30 and on a periphery of the cover 34.

The invention has the following advantages: The assembly of the cap (or cover) and the housing is quick, simple, and reliable due to the snapping coupling operation. Moreover, the waterproof coupling is reliable. Hence, rain, water, and moisture are prevented from entering the housing.

While the invention has been described in terms of preferred embodiments, those skilled in the art will recognize that the invention can be practiced with modifications within the spirit and scope of the appended claims.

What is claimed is:

1. An electric plug comprising:

an internally hollowed housing having an open rear end and including two forward prongs, a closed groove formed on an edge of the open rear end, and a closed trough formed on the edge of the open rear end wherein length of the trough is greater than that of the groove and the trough is disposed externally of the groove;

a transformer disposed in the internally hollowed housing and electrically connected to the prongs;

a cap including a closed projection formed on a forward end facing the rear end of the housing, and a closed protrusion formed on the forward end facing the rear end of the housing, wherein length of the protrusion is greater than that of the projection and the protrusion is disposed externally of the projection;

an electrical socket disposed through the cap and electrically connected to the transformer; and adhesive disposed in the groove;

wherein the projection is complimentarily disposed in the groove to press the adhesive for forming a first waterproof structure; and wherein the protrusion is complimentarily disposed in the trough to form a second waterproof structure.

2. An electric plug comprising:

an internally hollowed housing having an open top and including two bottom prongs, closed groove formed on an edge of the open top, a closed trough formed on the edge of the open top, and a hollow member projecting out of a rear end wherein length of the trough is greater than that of the groove and the trough is disposed externally of the groove;

a transformer disposed in the internally hollowed housing and electrically connected to the prongs;

a cover open having an open bottom and including a covering member projecting out of a rear end, a closed projection formed on an edge of the open bottom facing the top of the housing, and a closed protrusion formed on the edge of the open bottom facing the top of the housing, wherein length of the protrusion is greater than that of the projection and the protrusion is disposed externally of the projection;

an electrical socket for securing rear ends of the hollow member and the covering member together and electrically connected to the transformer; and adhesive disposed in the groove;

wherein the projection is complimentarily disposed in the groove to press the adhesive for forming a first waterproof structure; and wherein the protrusion is complimentarily disposed in the trough to form a second waterproof structure.

* * * * *